(12) United States Patent
Satoh et al.

(10) Patent No.: US 10,381,931 B2
(45) Date of Patent: Aug. 13, 2019

(54) CONTROL SYSTEM OF BOOST CONVERTER AND CONTROL METHOD THEREOF

(71) Applicant: Toyota Jidosha Kabushiki Kaisha, Toyota-shi, Aichi-ken (JP)

(72) Inventors: Kazuyoshi Satoh, Owariasahi (JP); Yasuhiro Terao, Okazaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 16/106,827

(22) Filed: Aug. 21, 2018

(65) Prior Publication Data

US 2019/0181758 A1    Jun. 13, 2019

(30) Foreign Application Priority Data

Dec. 8, 2017   (JP) ................. 2017-236104

(51) Int. Cl.
*H02M 3/158*    (2006.01)
*H02M 3/335*    (2006.01)
*G01R 31/00*    (2006.01)

(52) U.S. Cl.
CPC ..... *H02M 3/1582* (2013.01); *H02M 3/33569* (2013.01); *G01R 31/007* (2013.01)

(58) Field of Classification Search
CPC .............. H02M 3/158; H02M 3/1582; H02M 3/33569; Y02T 10/645; H02J 9/062
USPC .... 363/16–17, 37, 41, 56.02, 123, 127, 132; 318/701, 760, 779, 800, 801, 400.3, 318/410.1; 307/62, 64, 66, 72, 82
See application file for complete search history.

(56) References Cited

U.S. PATENT DOCUMENTS

| 7,525,278 | B2* | 4/2009 | Ochiai | B60L 3/003 |
| | | | | 318/779 |
| 9,467,087 | B2* | 10/2016 | Kondo | H02P 27/085 |
| 9,899,916 | B2* | 2/2018 | Okamura | H02M 3/156 |
| 2008/0143286 | A1* | 6/2008 | Egami | B60L 50/16 |
| | | | | 318/432 |
| 2009/0279337 | A1* | 11/2009 | Hamatani | B60L 3/12 |
| | | | | 363/132 |
| 2013/0060499 | A1* | 3/2013 | Yoshimura | G01K 3/14 |
| | | | | 702/99 |
| 2015/0280565 | A1* | 10/2015 | Okamura | B60L 11/08 |
| | | | | 307/10.1 |

(Continued)

FOREIGN PATENT DOCUMENTS

| JP | 2006-320069 A | 11/2006 |
| JP | 2011-087406 A | 4/2011 |

(Continued)

*Primary Examiner* — Rajnikant B Patel
(74) *Attorney, Agent, or Firm* — Dinsmore & Shohl LLP (57) ABSTRACT

In a control system of a boost converter and a control method of the control system, when a temperature of a current sensor of a boost converter is within a prescribed temperature range, an electronic control unit performs i) executing intermittent step-up control of the boost converter and learning of an offset value of the current sensor, and ii) controlling the boost converter using a corrected current value. The corrected current value is a value obtained by correcting a detected value of the current sensor using a correction value. The correction value is calculated using the learned offset value and the temperature of the current sensor.

12 Claims, 8 Drawing Sheets

(56) References Cited

U.S. PATENT DOCUMENTS

2016/0332529 A1 11/2016 Kumazawa et al.
2017/0212154 A1 7/2017 Otsuka et al.

FOREIGN PATENT DOCUMENTS

| JP | 2012-248421 A | 12/2012 |
| JP | 2015-139282 A | 7/2015 |
| JP | 2017-129528 A | 7/2017 |

* cited by examiner

CONTROL SYSTEM OF BOOST CONVERTER AND CONTROL METHOD THEREOF

CROSS-REFERENCE TO RELATED APPLICATIONS

This application claims priority to Japanese Patent Application No. 2017-236104 filed on Dec. 8, 2017, which is incorporated herein by reference in its entirety including the specification, drawings and abstract.

BACKGROUND

1. Technical Field

The disclosure relates to a control system of a boost converter and a control method thereof, and more particularly, to a control system including a boost converter and a current sensor and a control method thereof.

2. Description of Related Art

In the related art, a control system including a boost converter (a DC/DC converter) and a current sensor that detects a current flowing in the boost converter has been proposed as such a type of control system (for example, see Japanese Unexamined Patent Application Publication No. 2012-248421 (JP 2012-248421 A)). In such a control system, when switching elements of the boost converter are stopped and an output voltage of the boost converter is higher than an input voltage, that is, no current flows in the current sensor, learning of an offset value of the current sensor (origin learning) is executed.

SUMMARY

In such a control system, since an offset value of the current sensor has temperature characteristics, the offset value of the current sensor changes with change of the temperature of the current sensor itself. Accordingly, regardless of the temperature of the current sensor, learning, of an offset value of the current sensor (origin learning) cannot be appropriately executed when no current flows in the current sensor and the boost converter cannot be appropriately controlled.

A control system according to an aspect of the disclosure includes a boost converter, a current sensor, and an electronic control unit. The boost converter is configured to exchange power between a first power line and a second power line through conversion of a voltage. The first power line is connected to a power storage device and the second power line is connected to an inverter that drives a motor. The current sensor is configured to detect a current flowing in the boost converter. The electronic control unit is configured to control the boost converter using a detected value detected by the current sensor. The electronic control unit is configured to perform the following operations i) and ii) when a temperature of the current sensor is within a prescribed temperature range: i) executing intermittent step-up control and learning of an offset value of the current sensor, the intermittent step-up control being control of intermittently operating the boost converter such that a voltage of the second power line becomes a target voltage; and ii) controlling the boost converter using a corrected current value. The corrected current value is a value obtained by correcting the detected value using a correction value. The correction value is calculated using the learned offset value and the temperature of the current sensor.

This control system includes the current sensor that detects a current flowing in the boost converter, and controls the boost converter using a detected value detected by the current sensor. When the temperature of the current sensor is within a prescribed temperature range, the intermittent step-up control of intermittently operating the boost converter such that the voltage of the second power line becomes a target voltage is executed and the offset value of the current sensor is learned. The "prescribed temperature range" is prescribed as a temperature range of the current sensor in which the offset value of the current sensor is learned. By executing the intermittent step-up control and the learning of the offset value of the current sensor in a period in which the value of the current flowing in the boost converter is zero, it is possible to learn the offset value more appropriately. The boost converter is controlled using a corrected current value obtained by correcting the detected value using a correction value which is corrected using the learned offset value and the temperature of the current sensor. Accordingly, in comparison with a case in which at detected value is corrected using a learned value obtained by learning without considering the temperature of the current sensor, it is possible to set the correction value more appropriately and to control the boost converter more appropriately.

The electronic control unit may be configured to prepare a correction value table using the learned offset value and a learning temperature when the offset value has been learned. The learning temperature is the temperature of the current sensor when the learned offset value is being learned. The electronic control unit may be configured to set a value acquired from the correction value table using the temperature of the current sensor as the correction value.

According to this configuration, it is possible to set the correction value more appropriately and to control the boost converter using the corrected current value which is more appropriately set.

The electronic control unit may be configured not to execute the learning of the offset value when the temperature of the current sensor is within the prescribed temperature range and the learning of the offset value in the prescribed temperature range has been already executed.

According to this configuration, it is possible to control the boost converter more appropriately.

The electronic control unit may be configured to initialize a result of learning of the offset value when a request for stopping the control system has been issued.

According to this configuration, it is possible to correct the detected value using the correction value based on aging of the current sensor.

The electronic control unit may include a nonvolatile memory that stores data. The electronic control unit may be configured to store the learned offset value in the nonvolatile memory when the offset value has been learned. The electronic control unit may be configured to calculate the correction value from the temperature of the current sensor and the learned offset value stored in the nonvolatile memory.

According to this configuration, the learned offset value is stored in the nonvolatile memory at the time of starting of the control system. Therefore, it is possible to control the boost converter appropriately from the time of starting.

The electronic control unit may be configured to count the number of times of starting of the control system after learning of the offset value has been executed. The electronic control unit may be configured to initialize the learned offset value stored in the nonvolatile memory when the counted number of times of starting of the control system is greater than a predetermined number of times.

According to this configuration, it is possible to decrease the number of times of executing the learning of the offset value and to correct the detected value using the correction value based on aging of the current sensor.

The electronic control unit may be configured to perform the operations i) and ii) described above when the temperature of the current sensor is in one prescribed temperature range of a plurality of prescribed temperature ranges. The electronic control unit may be configured to count the number of times of starting of the control system after learning of the offset value has been executed for each of the plurality of prescribed temperature ranges. The electronic control unit may be configured to initialize the learned offset value in the prescribed temperature range in which the counted number of times of starting is greater than a predetermined number of times among the learned offset values stored in the nonvolatile memory, when the counted number of times of starting of the control system is greater than the predetermined number of times.

By initializing the offset value in the prescribed temperature range in which the number of times of starting of the control system is greater than a predetermined number of times, it is possible to decrease the number of times of executing the learning of the offset value. For example, it is possible to decrease the number of times of executing the learning in comparison with a case in which a prescribed temperature range is not considered and the number of times of starting of the control system is counted, and the offset value stored in the nonvolatile memory is initialized when the counted number of times of starting is greater than a predetermined number of times.

In a control method for a control system according to another aspect of the disclosure, the control system includes a boost converter, a current sensor, and an electronic control unit. The boost converter is configured to exchange power between a first power line and a second power line through conversion of a voltage. The first power line is connected to a power storage device and the second power line is connected to an inverter that drives a motor. The current sensor is configured to detect a current flowing in the boost converter. The control method includes following operations iii) and iv) when a temperature of the current sensor is within a prescribed temperature range: iii) executing, by the electronic control unit, intermittent step-up control and learning of an offset value of the current sensor, where the intermittent step-up control is control of intermittently operating the boost converter such that a voltage of the second power line becomes a target voltage; and iv) controlling, by the electronic control unit, the boost converter using a corrected current value, where the corrected current value is a value obtained by correcting a detected value using a correction value and the correction value is calculated using the learned offset value and the temperature of the current sensor.

In this control method, the control system includes the current sensor that detects a current flowing in the boost converter, and controls the boost converter using a detected value detected by the current sensor. When the temperature of the current sensor is within a prescribed temperature range, the intermittent step-up control of intermittently operating the boost converter such that the voltage of the second power line becomes a target voltage is executed and the offset value of the current sensor is learned. The "prescribed temperature range" is prescribed as a temperature range of the current sensor in which the offset value of the current sensor is learned. By executing the intermittent step-up control and learning the offset value of the current sensor in a period in which the value of the current flowing in the boost converter is zero, it is possible to learn the offset value more appropriately. The boost converter is controlled using a corrected current value obtained by correcting the detected value using a correction value which is corrected using the learned offset value and the temperature of the current sensor. Accordingly, in comparison with a case in which a detected value is corrected using a learned value obtained by learning without considering the temperature of the current sensor, it is possible to set the correction value more appropriately and to control the boost converter more appropriately.

BRIEF DESCRIPTION OF THE DRAWINGS

Features, advantages, and technical and industrial significance of exemplary embodiments will be described below with reference to the accompanying drawings, in which like numerals denote like elements, and wherein:

FIG. 6 is a diagram illustrating an example of a relationship between the temperature and the offset value ILoff of a current sensor 40a;

DETAILED DESCRIPTION OF EMBODIMENTS

Hereinafter, an embodiment will be described with reference to the accompanying drawings.

Figure 1:
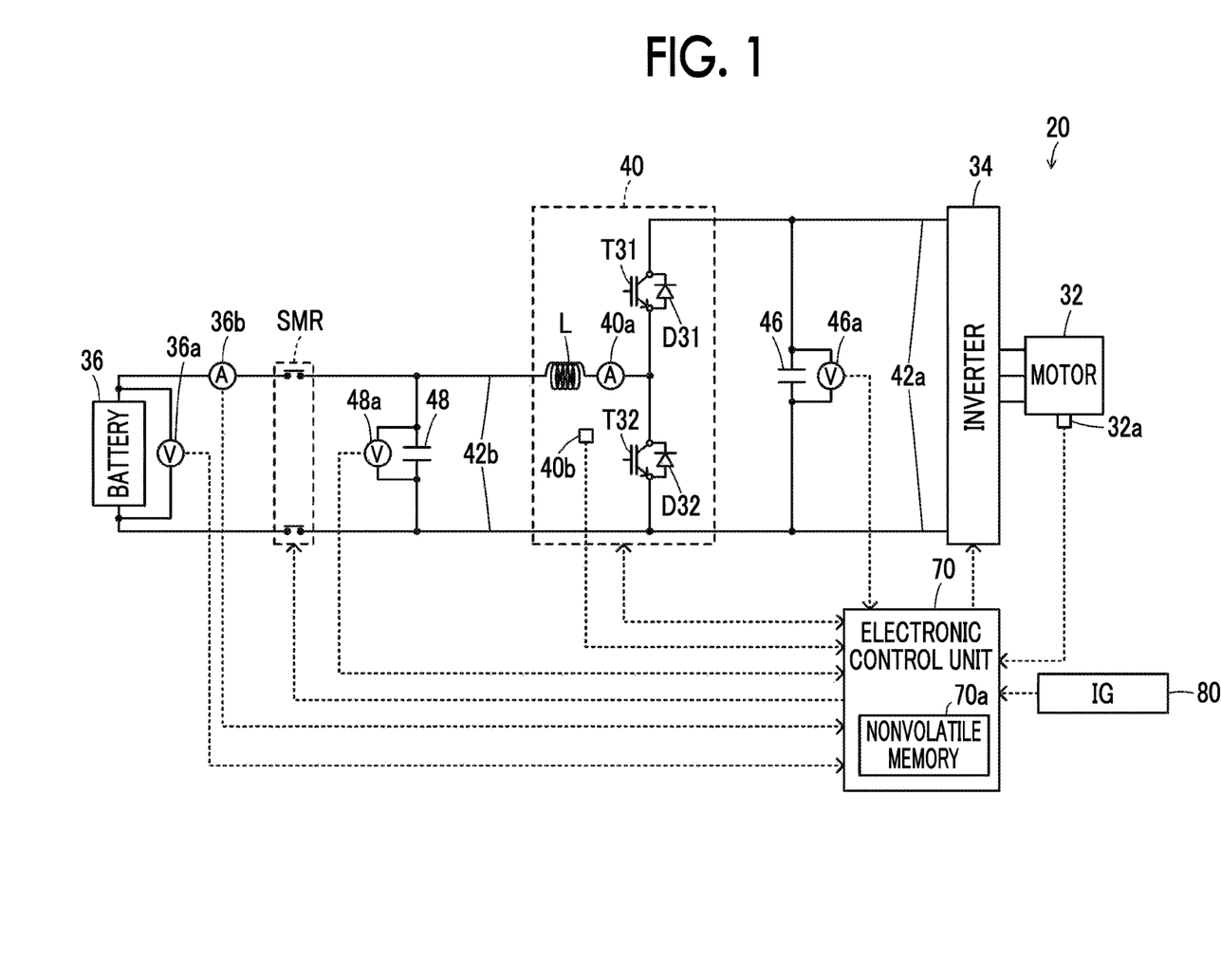
FIG. 1 is a diagram schematically illustrating a configuration of a drive device 20 in which a control system according to an embodiment of the disclosure is mounted.

FIG. 1 is a diagram schematically illustrating a configuration of a drive device 20 in which a control system according to an embodiment of the disclosure is mounted. As illustrated in the drawing, the drive device 20 according to the embodiment includes a motor 32, an inverter 34, a battery 36, a boost converter 40, capacitors 46 and 48, a system main relay SMR, and an electronic control unit (ECU) 70. The drive device 20 is mounted, for example, in an electric vehicle which runs with power from the motor 32.

The motor 32 is configured as a synchronous generator motor and includes a rotor that has a permanent magnet embedded therein and a stator on which three-phase coils are wound.

The inverter 34 is connected to the motor 32 and is also connected to a high-voltage power line 42a. The inverter 34 includes e plurality of transistors (switching elements) which are not illustrated. The motor 32 is rotationally driven by causing the ECU 70 to control switching of the plurality of transistors of the inverter 34 when a voltage is applied to the high-voltage power line 42a.

The battery 36 is configured, for example, as a lithium-ion secondary battery or a nickel-hydride secondary battery with a rated voltage of 200 V or 250 V and is connected to a low-voltage power line 42b as a second power line.

The boost converter 40 is connected to the high-voltage power line 42a and the low-voltage power line 42b. The boost converter 40 includes two transistors T31, T32, two diodes D31, D32 that are connected in parallel to the two transistors T31, T32, and a reactor L. The transistor T31 is connected to a positive electrode line of the high-voltage power line 42a. The transistor T32 is connected to the transistor T31 and negative electrode lines of the high-voltage power line 42a and the low-voltage power line 42b. The reactor L is connected to a junction between the transistors T31, T32 and a positive electrode line of the low-voltage power line 42b. An ON-time ratio of the transistors T31, T32 is adjusted by the ECU 70, whereby the boost converter 40 steps up electric power of the low-voltage power line 42b and supplies the stepped-up electric power to the high-voltage power line 42a or steps down electric power of the high-voltage power line 42a and supplies the stepped-down electric power to the low-voltage power line 42b. The capacitor 46 is connected to the positive electrode line and the negative electrode line of the high-voltage power line 42a, and the capacitor 48 is connected to the positive electrode line and the negative electrode line of the low-voltage power line 42b.

The system main relay SMR is provided on the battery 36 side of the capacitor 48 in the low-voltage power line 42b. Turning ON and OFF of the system main relay SMR is controlled by the ECU 70, such that the system main relay SMR performs connection and disconnection between the battery 36 and the capacitor 48 side.

The ECU 70 is configured as a microprocessor including a CPU which is not illustrated and includes a ROM that stores processing programs or various maps, a RAM that temporarily stores data, and input and output ports in addition to the CPU. The ECU 70 additionally includes a nonvolatile memory 70a.

Signals from various sensors are input to the ECU 70 via the input port. Examples of the signals input to the ECU 70 include a rotational position $\theta m$ from a rotational position sensor 32a that detects a rotational position of the rotor of the motor 32 and phase currents Iu and Iv from current sensors that detect currents flowing in phases of the motor 32. Examples thereof further include a voltage Vb of the battery 36 from a voltage sensor 36a that is attached between the terminals of the battery 36 and a current Ib of the battery 36 from a current sensor 36b that is attached to the output terminal of the battery 36. Examples thereof further include a voltage VH of the capacitor 46 (a voltage of the high-voltage power line 42a) from a voltage sensor 46a that is attached between the terminals of the capacitor 46, a voltage VL of the capacitor 48 (a voltage of the low-voltage power line 42b) from a voltage sensor 48a that is attached between the terminals of the capacitor 48, and a detected value ILd from a current sensor 40a that detects a current flowing in the reactor L of the boost converter 40. Examples thereof further include a sensor temperature Ts from a temperature sensor 40b that is attached to the vicinity of the current sensor 40a to detect a temperature of the current sensor 40a. Examples thereof further include an ignition signal from an ignition switch 80.

Various control signals are output from the ECU 70 via the output port. Examples of the signals output from the ECU 70 include a switching control signal to a plurality of transistors which are not illustrated in the inverter 34 and a switching control signal to the transistors T31, T32 of the boost converter 40. The ECU 70 calculates an electrical angle $\theta e$ or a rotation speed Nm of the motor 32 based on the rotational position $\theta m$ of the rotor of the motor 32 obtained from the rotational position sensor 32a. The ECU 70 calculates a state of charge SOC of the battery 36 based on an integrated value of the current Ib of the battery 36 obtained from the current sensor 36b. Here, the state of charge SOC is a ratio of a power capacity which can be discharged from the battery 36 to the total capacity of the battery 36.

In the drive device 20 according to the embodiment having the above-mentioned configuration, the ECU 70 executes the following driving control. In the driving control, a torque command Tm* for the motor 32 is set and switching control of a plurality of transistors of the inverter 34 is executed such that the motor 32 is driven with the torque command Tm*. A target voltage VH* of the high-voltage power line 42a is set such that the motor 32 is driven at a target operating point (the torque command Tm* and the rotation speed Nm). A target current IL* of the reactor L of the boost converter 40 is set such that the voltage VH of the high-voltage power line 42a becomes the target voltage VH*. Switching control of the transistors T31, T32 of the boost converter 40 is executed such that the current IL of the reactor L of the boost converter 40 becomes the target current IL*. Accordingly, electric power from the battery 36 is stepped up and then is supplied to the motor 32 via the inverter 34.

An operation of the drive device 20 according to the embodiment having the above-mentioned configuration will be described below. Particularly, an operation when an offset value of the current sensor 40a is learned (zero-point learning is executed) and an operation when a detected value ILd detected by the current sensor 40a is corrected using the learned offset value, will be described below.

Figure 2:
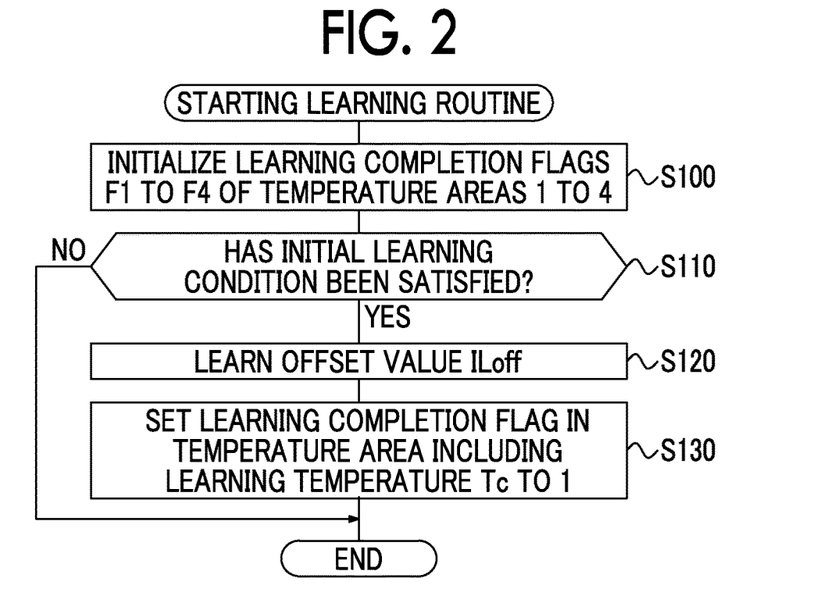
FIG. 2 is a flowchart illustrating an example of a starting learning routine which is performed by a CPU of an ECU 70.
Figure 3:
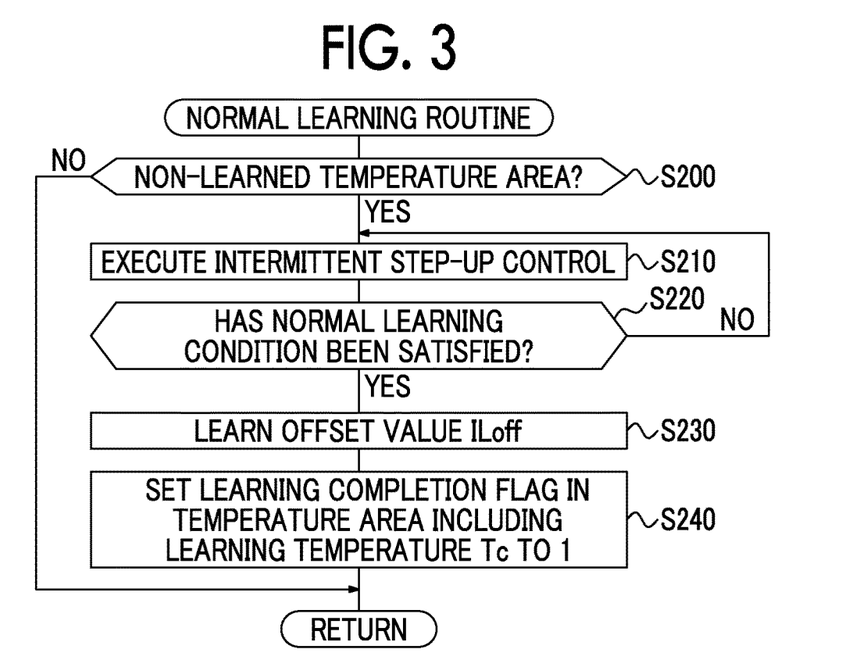
FIG. 3 is a flowchart illustrating an example of a normal learning routine which is performed by the CPU of the ECU 70.

An operation when the offset value of the current sensor 40a is learned (zero-point learning is executed) will be first described. FIG. 2 is a flowchart illustrating an example of a starting learning routine which is performed by the CPU of the ECU 70. The starting learning routine is performed immediately after the ignition switch 80 is turned on and the drive device 20 is started. FIG. 3 is a flowchart illustrating a normal learning routine which is performed by the CPU of the ECU 70. The normal learning routine is repeatedly performed until the ignition switch 80 is turned off and the system of the drive device 20 is stopped after the starting learning routine illustrated in FIG. 2 has been performed. The starting learning routine illustrated in FIG. 2 and the normal learning routine illustrated in FIG. 3 will be sequentially described. The CPU of the ECU 70 turns on the system main relay SMR when the ignition switch 30 is turned on and the drive device 20 is started, and turns off the system main relay SMR when the ignition switch 80 is turned off and the drive device 20 is stopped.

First, the starting learning routine illustrated in FIG. 2 will be described. When the starting learning routine is performed, the CPU of the ECU 70 performs process of initializing learning completion flags F1 to F4 of four Temperature Areas 1 to 4 of the sensor temperature Ts (Step S100). In other words, values of the learning completion flags F1 to F4 are set to zero. Here, Temperature Areas 1 to 4 are set to temperature ranges obtained by partitioning a range of temperature which can be taken by the current sensor 40a into predetermined temperature intervals T. In the embodiment, the range of temperature which can be taken by the boost converter 40 is set to range from 0° C. to 80° C., the predetermined temperature interval T is set to 20° C., Temperature Area 1 is set to a range which is equal to or higher than 0° C. and less than 20° C., Temperature Area 2 is set to a range which is equal to or higher than 20° C. and less than 40° C., Temperature Area 3 is set to a range which is equal to or higher than 40° C. and less than 60° C., and Temperature Area 4 is set to a range which is equal to or higher than 60° C. and less than 80° C. Since the learning completion flags F1 to F4 are initialized in Step S100, the learning completion flags F1 to F4 are initialized whenever the drive device 20 is started.

Subsequently, it is determined whether an initial learning condition has been satisfied (Step S110). In this process, it is determined that the initial learning condition has been satisfied, when the boost converter 40 is in a state in which an actual current of the reactor L has a value of 0 such as when switching control of the transistors T31, T32 of the boost converter 40 has not been started. When it is determined in Step S110 that the initial learning condition has not been satisfied, the starting learning routine ends.

When it is determined in Step S110 that the initial learning condition has been satisfied, it is determined that the actual current of the reactor L has a value of 0 and learning of an offset value ILoff of the current sensor 40a is executed (Step S120). In this learning, a detected value ILd detected by the current sensor 40a and a sensor temperature Ts detected by the temperature sensor 40b are input a prescribed number of times Nref (for example, 128 times, 256 times, or 512 times). An average value of the input sensor temperatures Ts is set as a learning temperature Tc and an average value of the input detected values ILd is set as the offset value ILoff at the learning temperature Tc. In this way, since the learning temperature Tc and the offset value ILoff at the learning temperature Tc are set when the actual current of the reactor L has a value of 0, it is possible to set the offset value ILoff more appropriately. By inputting the detected value ILd detected by the current sensor 40a a prescribed number of times Nref (for example, 128 times, 256 times, or 512 times) and setting the average value of the input detected values ILd as the offset value ILoff, it is possible to set the offset value ILoff more accurately even when the detected value ILd input from the current sensor 40a varies due to noise or the like.

When the initial learning of the offset value ILoff is executed in this way, the learning completion flag (one of the learning completion flags F1 to F4) corresponding to a temperature area including the learning temperature Tc among Temperature Areas 1 to 4 in Step S120 is set to a value of 1 (Step S130) and the starting learning routine ends.

The normal learning routine illustrated in FIG. 3 will be described next. When the normal learning routine is performed, the CPU of the ECU 70 receives a sensor temperature Ts detected by the temperature sensor 40b and performs a process of determining whether the sensor temperature Ts is included in a non-learned area (Step S200). This determination is performed by identifying a temperature area including a current sensor temperature Ts (the sensor temperature Ts in step S200) among Temperature Areas 1 to 4 and determining that the sensor temperature Ts is included in a non-learned area when the learning completion flag (one of the learning completion flags F1 to F4) of the identified temperature area has a value of 0. When the sensor temperature Ts is not included in a non-learned area, it is determined that learning at the current sensor temperature Ts has been completed and the normal learning routine ends.

When the sensor temperature Ts is included in a non-learned area, intermittent step-up control of the boost converter 40 is executed (Step S210). In the intermittent step-up control, the target current IL* of the reactor L of the boost converter 40 is set such that the voltage VH of the high-voltage power line 42a is a voltage slightly higher than the target voltage VH*. Switching control of the transistors T31, T32 of the boost converter 40 is executed such that the current IL of the reactor L of the boost converter 40 becomes the target current IL*. When the voltage VH is a voltage slightly higher than the target voltage VH*, switching control of the transistors T31 and T32 is stopped (the transistors T31, T32 are turned off). When the voltage VH is a voltage slightly lower than the target voltage VH*, switching control of the transistors T31 and T32 of the boost converter 40 is started such that the voltage VH is a voltage slightly higher than the target voltage VH*. In this way, in the intermittent step-up control, stopping and executing of the switching control of the boost converter 40 are repeated to intermittently operate the boost converter 40. In the intermittent step-up control, the current IL actually flowing in the reactor L has a value of 0 in a period in which switching control of the transistors T31, T32 is stopped.

When execution of intermittent step-up control is started in this way, it is determined whether a normal learning condition has been satisfied (Step S220). In this process, when the actual current of the reactor L is estimated to have a value of 0 such as when switching control of the transistors T31, T32 of the boost converter 40 is stopped, it is determined that the normal learning condition has been satisfied. When the normal learning condition has not been satisfied, the routine returns to Step S210 and the processes of Steps S210 and S220 are repeatedly performed until the normal learning condition has been satisfied.

When it is determined in step S220 that the normal learning condition has been satisfied, the offset value ILoff is learned in the same process as Step S120 (Step S230), the learning completion flag (one of the learning completion flags F1 to F4) corresponding to the temperature area including the learning temperature Tc set in Step S230 among Temperature Areas 1 to 4 is set to a value of 1 in the same process as Step S130 (Step S240), and the normal learning routine ends. The offset value ILoff can be set depending on the learning temperature Tc through these processes. Since the offset value ILoff is set when the detected value ILd detected by executing the intermittent step-up control has a value of 0, it is possible to set the offset value ILoff more appropriately by intermittent step-up control. Since the detected value ILd detected by the current sensor 40a is input a prescribed number of times Nref (for example, 128 times, 256 times, or 512 times) and the average value of the input detected values ILd is set as the offset value ILoff, it is possible to set the offset value ILoff more accurately even when the detected value ILd input from the current sensor 40a varies due to noise or the like.

Figure 4:
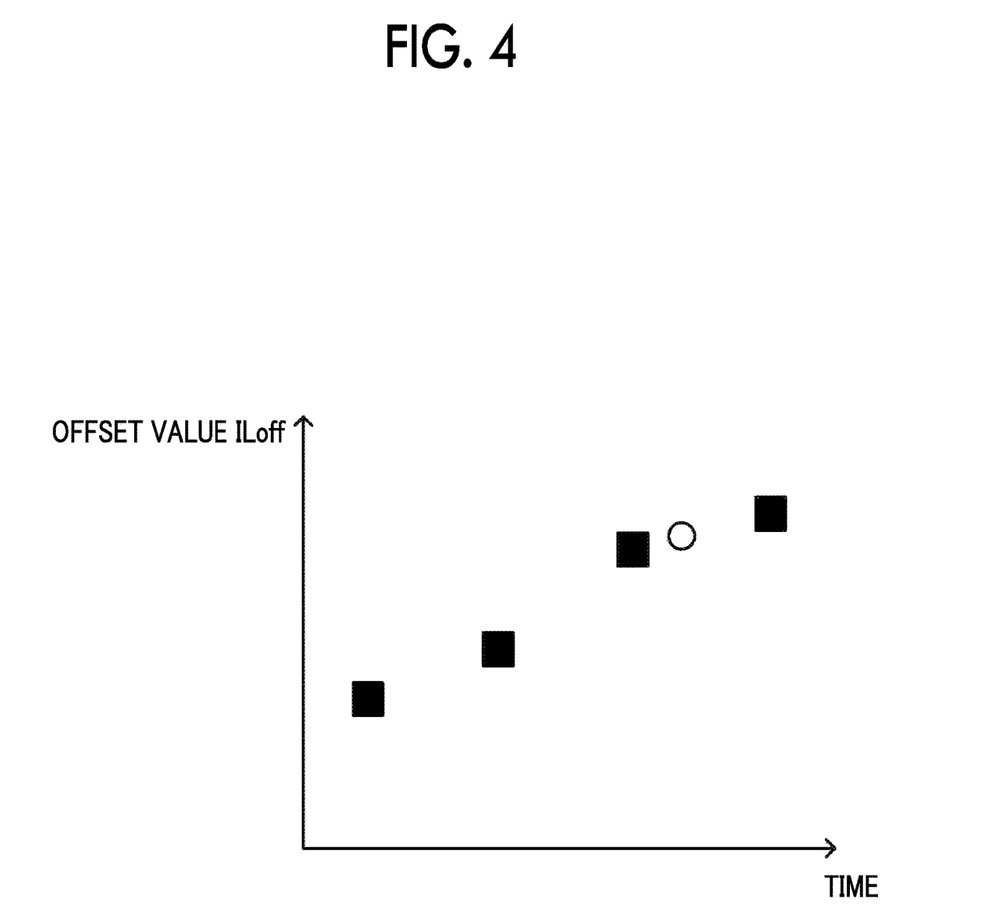
FIG. 4 is a timing chart illustrating an example of an offset value ILoff over time.

FIG. 4 is a timing chart illustrating an example of change of the offset value ILoff over time. In the drawing, black rectangle marks indicate an example of change of the offset value ILoff over time in the drive device 20 according to the embodiment. In the drawing, a white circle mark indicates an example of change of the offset value ILoff over time in a drive device according to the related art. In such a related art, intermittent step-up control is not executed and the offset value ILoff is learned when the current IL has a value of 0 slightly after the drive device is started. As illustrated in the drawing, since intermittent step-up control is executed in the drive device 20 according to the embodiment, opportunities that the actual current of the reactor L having a value of 0 are more than that in a case in which intermittent step-up control is not executed. Therefore, it is possible to increase the opportunities to learn the offset value ILoff.

Figure 5:
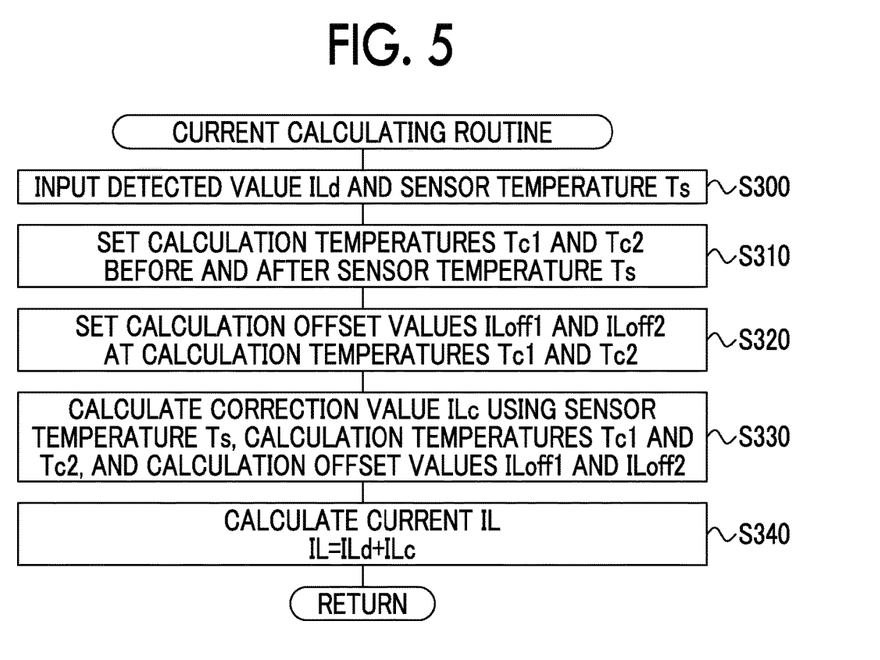
FIG. 5 is a flowchart illustrating an example of a current calculating routine of calculating a current IL of a reactor L which is performed by the CPU of the ECU 70.

An operation when the detected value ILd detected by the current sensor 40a is corrected using the learned offset value ILoff will be described next. FIG. 5 is a flowchart illustrating an example of a current calculating routine of calculating the current IL of the reactor L which is performed by the CPU of the ECU 70. The current calculating routine is repeatedly performed every predetermined time (for example, several msec) in a period until the ignition switch 80 is turned off after the ignition switch 80 is turned on to start the drive device 20.

When the current calculating routine is performed, the CPU of the ECU 70 performs a process of inputting the detected value ILd of the reactor current IL and the sensor temperature Ts of the boost converter 40 (Step S300). A value detected by the current sensor 40a is input as the detected value ILd. A value detected by the temperature sensor 40b is input as the sensor temperature Ts.

Subsequently, calculation temperatures Tc1 and Tc2 are set using the stored learning temperature Tc and the current sensor temperature Ts input in Step S300 (Step S310). The calculation temperature Tc1 is selected from among the learning temperatures Tc set in the process of Step S120 illustrated in FIG. 2 or Step S230 illustrated in FIG. 3. A temperature closest to and lower than the current sensor temperature Ts input in Step S300 is selected as the calculation temperature Tc1. The calculation temperature Tc2 is selected from among the learning temperatures Tc set in the process of Step S120 illustrated in FIG. 2 or Step S230 illustrated in FIG. 3. A temperature closest to and higher than the current sensor temperature Ts input in Step S300 is selected as the calculation temperature Tc2. In the process of Step S320, a temperature slightly lower than the current sensor temperature Ts is set to the calculation temperature Tc1 and a temperature slightly higher than the current sensor temperature Ts is set to the calculation temperature Tc2.

When the calculation temperatures Tc1 and Tc2 are set in this way, the offset values ILoff corresponding to the calculation temperatures Tc1 and Tc2 are set as calculation offset values ILoff1 and ILoff2 (Step S320). The calculation offset values ILoff1 and ILoff2 are selected from among the offset values ILoff set in the process of Step S120 illustrated in FIG. 2 or Step S230 illustrated in FIG. 3. A correction value ILc is calculated from Equation (1) using the current sensor temperature Ts, the calculation temperatures Tc1 and Tc2, and the calculation offset values ILoff1 and ILoff2 (Step S330). Finally, a value obtained by adding the correction value ILc to the detected value ILd input in the process of Step S300 is set as the reactor current IL (Step S340), and then the current calculating routine ends.

$$ILc=(Ts-Tc1)\cdot(ILoff2-ILoff1)/(Tc2-Tc1) \quad (1)$$

Figure 6:
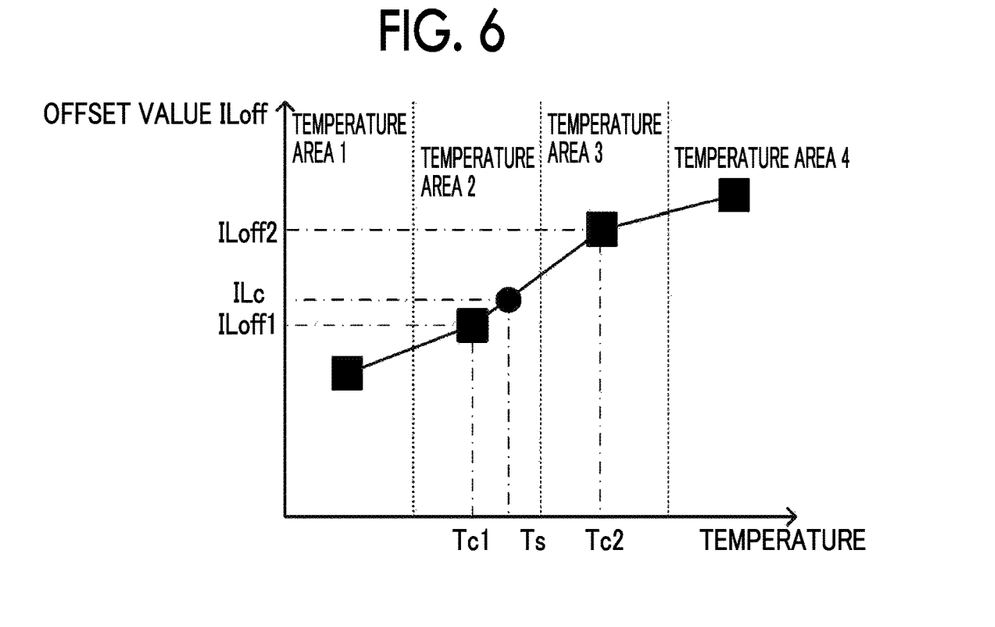

FIG. 6 is a diagram illustrating an example of a relationship between the temperature of the current sensor 40a and the offset value ILoff. In the drawing, black rectangle marks indicate the learning temperatures Tc in Temperature Areas 1 to 4, and a black circle mark indicates the current sensor temperature Ts. As illustrated in the drawing, the correction value ILc is set based on the calculation offset values ILoff1 and ILoff2 and the current sensor temperature Ts. The calculation offset values ILoff1 corresponds to the calculation temperature Tc1 which is the learning temperature that is slightly lower than the current sensor temperature Ts. The calculation offset values ILoff2 corresponds to the calculation temperature Tc2 which is the learning temperature that is slightly higher than the current sensor temperature Ts. Accordingly, in comparison with a case in which the correction value for the detected value ILd is set using a learned value obtained without considering the temperature of the current sensor 40a, it is possible to set the correction value ILc more appropriately and to control the boost converter 40 more appropriately.

In the drive device 20 in which the above-mentioned control system according to the embodiment is mounted, intermittent step-up control is executed when the temperature of the current sensor 40a is in a non-learned temperature area in which learning is not completed. The offset value ILoff is learned and the boost converter is controlled using a current IL obtained by correcting the detected value ILd using the learned offset value ILoff when the normal learning condition has been satisfied. Specifically, the current ILoff is obtained by correcting the detected value ILd using the correction value ILc, and the correction value ILc is calculated using the learned offset value ILoff and the sensor temperature Ts. Accordingly, in comparison with a case in which the correction value for the detected value ILd is corrected using a learned value obtained without considering the temperature of the current sensor 40a, it is possible to set the correction value ILc more appropriately and to control the boost converter 40 more appropriately.

In the control system according to the embodiment, the learning completion flags F1 to F4 are initialized in the process of Step S100 of the starting learning routine illustrated in FIG. 2 and then the offset value ILoff is learned in Step S120 illustrated in FIG. 2 or Step S230 illustrated in FIG. 3. Since the learning completion flags F1 to F4 are initialized when the drive device 20 is started, the offset values ILoff of Temperature Areas 1 to 4 are learned whenever the drive device 20 is started. However, the number of times of executing of learning of the offset value ILoff may be decreased by performing a starting learning routine according to a first modified example illustrated in FIG. 7 instead of the starting learning routine illustrated in FIG. 2 and performing a normal learning routine according to the first modified example illustrated in FIG. 8 instead of the normal learning routine illustrated in FIG. 3. For the purpose of convenience of explanation, the normal learning routine illustrated in FIG. 8 will be first described and then the starting learning routine illustrated in FIG. 7 will be described.

Figure 8:
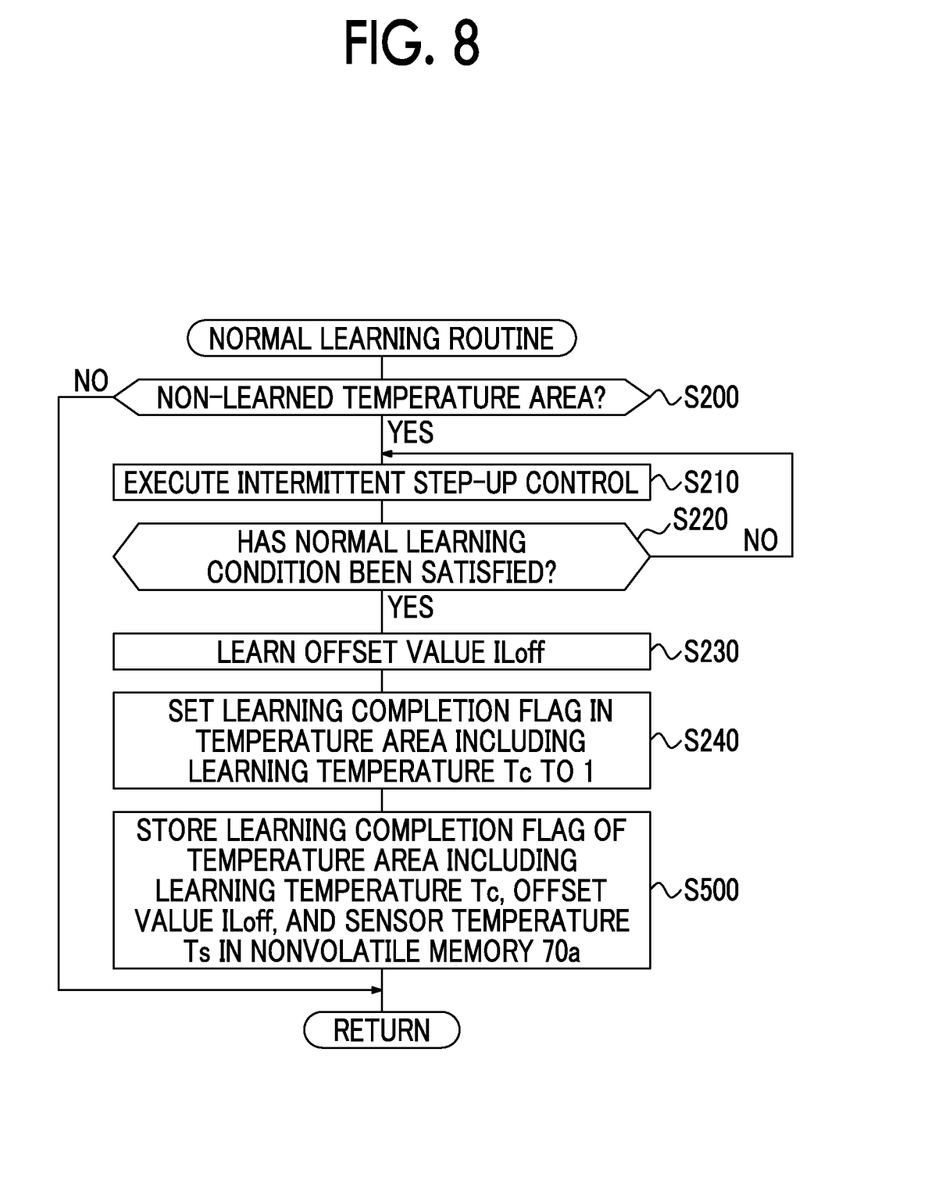
FIG. 8 is a flowchart illustrating an example of a normal learning routine according to the first modified example.

In the normal learning routine according to the first modified example illustrated in FIG. 8, the same processes as the normal learning routine illustrated in FIG. 3 are performed except that the process of Step S500 is performed after the process of Step S240. Accordingly, the same processes as the normal learning routine illustrated in FIG. 3 will be referred to by the same reference signs and detailed description thereof will not be repeated.

In the normal learning routine according to the first modified example illustrated in FIG. 8, when it is determined in Step S200 that the sensor temperature Ts is included in a non-learned area, the processes of Steps S200 to S240 are performed, the learning temperature Tc and the offset value ILoff set in Step S230 and the learning completion flag set in Step S240 are stored in the nonvolatile memory 70a (Step S500), and the normal learning routine ends. Through these processes, the learning temperature Tc, the offset value ILoff, and the learning completion flag set in Step S240 can be stored in the nonvolatile memory 70a when learning of the offset value ILoff has been executed.

Figure 7:
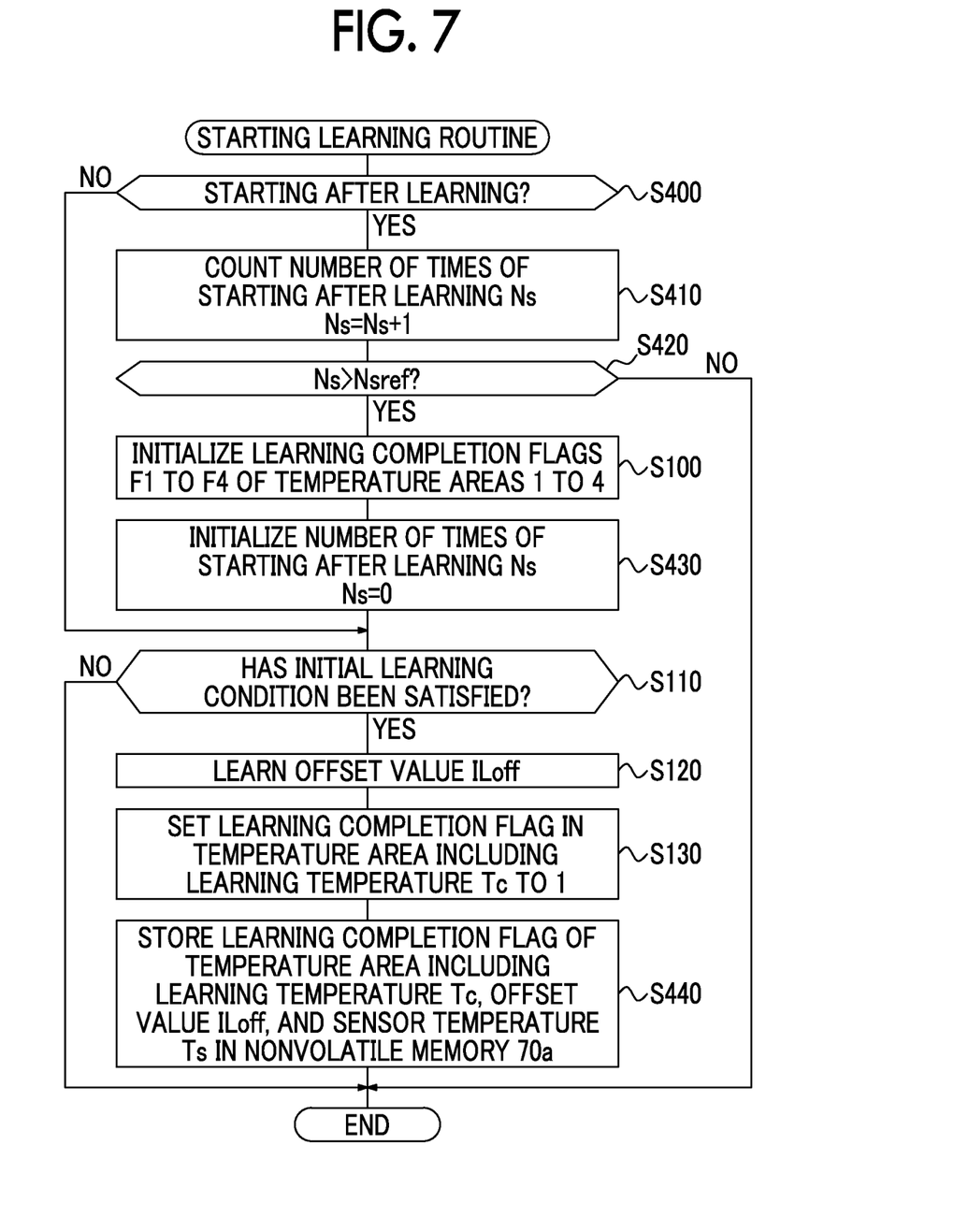
FIG. 7 is a flowchart illustrating an example of a starting learning routine according to a first modified example.

In the starting learning routine according to the first modified example illustrated in FIG. 7, the same processes as the starting learning routine illustrated in FIG. 2 are performed except that Steps S400 to S420 are performed before Step S100, Step S430 is performed between Step S100 and Step S110, and Step S440 is performed after Step S130. Accordingly, detailed description of the same processes as the starting learning routine illustrated in FIG. 2 will not be repeated.

In the starting learning routine according to the first modified example illustrated in FIG. 7, first, it is determined whether current starting of the drive device 20 is starting after learning of the offset value ILoff has been executed (Step S400). This determination is performed by determining whether the learning temperature Tc, the offset value ILoff, and one of the learning completion flags F1 to F4 is stored in the nonvolatile memory 70a, and determining that current starting of the drive device 20 is starting after learning of the offset value ILoff has been executed when they are stored therein. When current starting of the drive device 20 is not starting after learning of the offset value ILoff has been executed, it is determined whether the initial learning condition has been satisfied (Step S110). When the initial learning condition has not been satisfied, the starting learning routine ends.

When it is determined in Step S110 that the initial learning condition has been satisfied, learning of the offset value ILoff is executed, the learning completion flag of the temperature area including the learning temperature is set to a value of 1 (Steps S120 and S130), the learning temperature Tc and the offset value ILoff set in Step S120 and the learning completion flag set in Step S130 are stored in the nonvolatile memory 70a in the same process as Step S500 (Step S440), and this routine ends. Through these processes, the learning temperature Tc, the offset value ILoff, and the learning completion flag set in Step S130 can be stored in the nonvolatile memory 70a when learning of the offset value ILoff has been executed.

When it is determined in Step S400 that current starting of the drive device 20 is starting after learning of the offset value ILoff has been executed, the number of times of starting after learning Ns is counted (Step S410). The number of times of starting after learning Ns is set to a value of 0 as an initial value.

Subsequently, it is determined whether the number of times of starting after learning Ns is greater than a determination threshold value Nsref (Step S420). The determination threshold value Nsref is a threshold value that is used to determine whether an error occurs in the offset value ILoff by judging whether the number of time of starting in which learning of the offset value ILoff is not executed is large or not.

When it is determined in Step S420 that the number of times of starting after learning Ns is equal to or less than the determination threshold value Nsref, the learning temperature Tc, the offset value ILoff, and one of the learning completion flags F1 to F4 are already stored in the nonvolatile memory 70a, it is determined that learning of the offset value ILoff does not need to be executed in the starting learning routine, and the starting learning routine ends. In this case, if it is necessary, learning of the offset value ILoff is executed in the normal learning routine according to the first modified example illustrated in FIG. 8. Accordingly, in comparison with a case in which learning of the offset value ILoff is executed in every starting, it is possible to decrease the number of times of learning the offset value ILoff.

When it is determined in Step S420 that the number of times of starting after learning Ns is greater than the determination threshold value Nsref, the number of times of starting in which learning of the offset value ILoff is not executed is large. Therefore, it is determined that an error occurs in the offset value ILoff, and the learning completion flags F1 to F4 of Temperature Areas 1 to 4 are initialized (Step S100), the number of times of starting after learning Ns is initialized to a value of 0 (Step S430), the processes subsequent to Step S110 are performed, and the starting learning routine ends. Through these processes, if necessary, learning of the offset value ILoff is executed when the number of times of starting after learning Ns is greater than the determination threshold value Nsref, and thus it is possible to prevent the error of the offset value ILoff from becoming excessively large by decreasing the number of times of learning the offset value ILoff.

Figure 9:
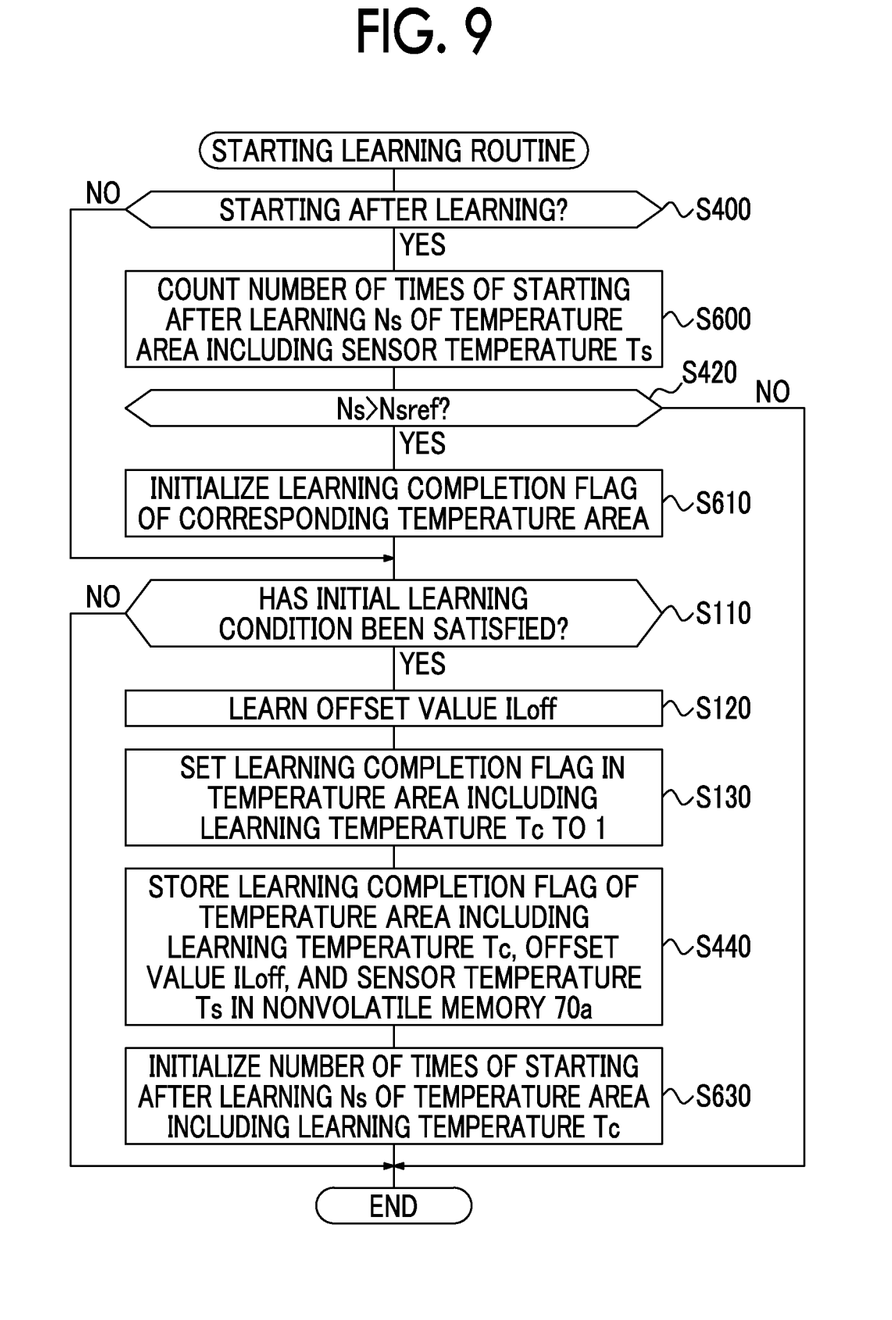
FIG. 9 is a flowchart illustrating an example of a starting learning routine according to a second modified example.

A starting learning routine according to a second modified example illustrated in FIG. 9 may be performed instead of the starting learning routine according to the first modified example illustrated in FIG. 7. A normal learning routine according to the second modified example illustrated in FIG. 10 may be performed instead of the normal learning routine according to the first modified example illustrated in FIG. 8.

In the starting learning routine according to the second modified example illustrated in FIG. 9, the same processes as the starting learning routine according to the first modified example illustrated in FIG. 7 are performed except that the process of Step S600 is performed instead of the process of Step S410, the process of Step S610 is performed instead of the process of Step S430, and the process of Step S630 is performed after the process of Step S440. Accordingly, the same processes as the starting learning routine according to the first modified example illustrated in FIG. 7 will be referred to by the same reference signs and detailed description thereof will not be repeated.

In the starting learning routine according to the second modified example illustrated in FIG. 9, first, it is determined whether current starting of the drive device 20 is starting after learning of the offset value ILoff has been executed (Step S400). When the current starting of the drive device 20 is not starting after learning of the offset value ILoff has been executed, the routine goes to the process of Step S110.

When the current starting of the drive device 20 is starting after learning of the offset value ILoff has been executed, the number of times of starting after learning Ns in the temperature area including the current sensor temperature Ts is counted (Step S600). The number of times of starting after learning Ns is set individually for Temperature Areas 1 to 4 and is set to a value of 0 as an initial value in the second modified example.

Subsequently, it is determined that the number of times of starting after learning Ns counted in Step S600 is greater than the determination threshold value Nsref (Step S420). When the number of times of starting after learning Ns is equal to or less than the determination threshold value Nsref, the learning temperature Tc in the temperature area including the current sensor temperature Ts, the offset value ILoff, and one of the learning completion flags F1 to F4 are already stored in the nonvolatile memory 70a. Therefore, it is determined that learning of the offset value ILoff does not need to be executed in the starting learning routine, and the starting learning routine ends. In this case, learning of the offset value ILoff is executed if necessary in the normal learning routine according to the second modified example illustrated in FIG. 10. Accordingly, in comparison with a case in which learning, of the offset value ILoff is executed in every starting, it is possible to decrease the number of times of learning the offset value ILoff.

When it is determined in Step S420 that the number of times of starting after learning Ns is greater than the determination threshold value Nsref, the number of times of starting in which learning of the offset value ILoff is not executed is large in the temperature area including the current sensor temperature Ts. Therefore, it is determined that an error occurs in the offset value ILoff, the learning completion flag (one of the learning completion flags F1 to F4) of the temperature area including the current sensor temperature Ts is set to a value of 0 for initialization (Step S610), and then the routine goes to the process of Step S110.

In the process of Step S110, it is determined whether the initial learning condition has been satisfied (Step S110). When the initial learning condition has not been satisfied, the starting learning routine ends.

When it is determined in Step S110 that the initial learning condition has been satisfied, learning of the offset value ILoff is executed (Step S120) and the learning completion flag of the temperature area including the learning temperature Tc set in Step S120 is set to a value of 1 (Steps S120 and S130). Then, the learning temperature Tc and the offset value ILoff set in Step S120 and the learning completion flag set in Step S130 are stored in the nonvolatile memory 70a (Step S440) in a process similar to Step S500 described above. Further, the number of times of starting after learning Ns of the temperature area including the learning temperature Tc set in Step S120 is initialized to a value of 0 (Step S630), and the starting learning routine ends. Through these processes, the number of times of starting after learning Ns of the temperature area including the learning temperature Tc is initialized when the learning of the offset value ILoff of Step S120 is executed. Therefore, it is determined that the number of times of starting after learning Ns is equal to or less than the determination threshold value Nsref when the drive device 20 is started next time and the process of Step S420 is performed. The starting learning routine ends without performing learning of the offset value ILoff. Accordingly, it is possible to decrease the number of times of learning the offset value ILoff.

Figure 10:
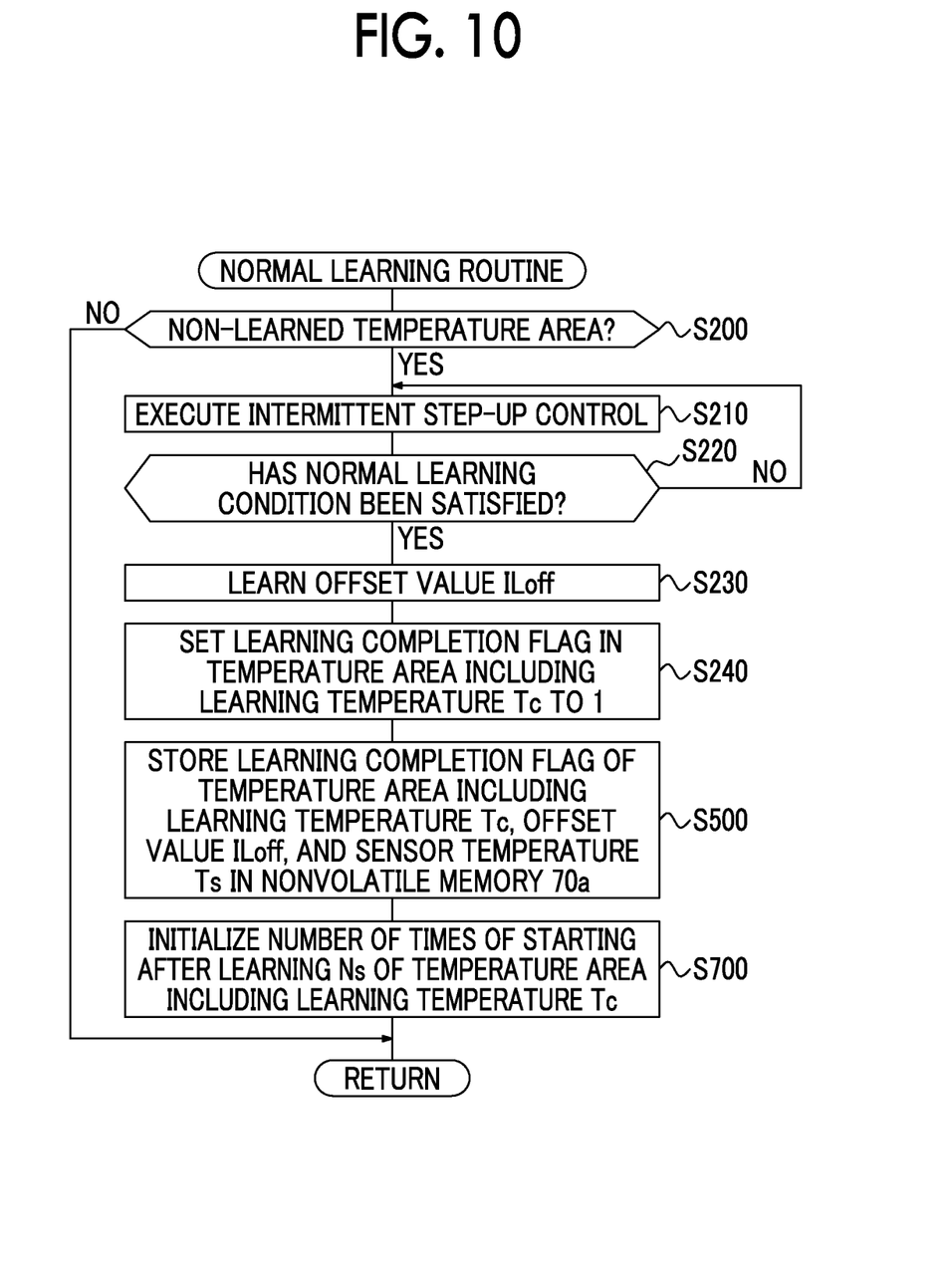
FIG. 10 is a flowchart illustrating an example of a normal learning routine according to the second modified example.

In the normal learning routine according to the second modified example illustrated in FIG. 10, the same processes as the normal learning routine according to the first modified example illustrated in FIG. 8 are performed except that the process of Step S700 is performed after the process of Step S500. Accordingly, the same processes as the normal learning routine according to the first modified example illustrated is FIG. 8 will be referred to by the same reference signs and detailed description thereof will not be repeated.

In the normal learning routine according to the second modified example illustrated in FIG. 10, when it is determined in Step S200 that the sensor temperature Ts is included in a non-learned area, the processes of Steps S210 to S240 are performed. Then, the learning temperature Tc and the offset value ILoff set in Step S230 and the learning completion flag set in Step S240 are stored in the nonvolatile memory 70a (Step S500), the number of times of starting after learning Ns of the temperature area including the learning temperature Tc which is used for the process of Step S200 is initialized to a value of 0 (Step S700), and the normal learning routine ends. When the drive device 20 is started next time and the process of Step S420 is performed, it is determined that the number of times of starting after learning Ns is equal to or less than the determination threshold value Nsref and the starting learning routine ends without executing learning of the offset value ILoff. Accordingly, it is possible to decrease the number of times of learning the offset value ILoff.

In the control system according to the embodiment, the learning completion flag is initialized in Step S100 of the starting learning routine illustrated in FIG. 7 or in Step S610 illustrated in FIG. 9. Instead of this, the offset value ILoff stored in the nonvolatile memory 70a may be initialized to a value of 0 at the same time as initializing the learning completion flag.

In the control system according to the embodiment, the temperature areas are set to temperature ranges obtained by dividing the temperature range which can be taken by the current sensor 40a at intervals of the predetermined temperature T, which is set to 20° C. However, the predetermined temperature T may be appropriately set. The temperature range which can be taken by the current sensor 40a needs to be divided into at least two, and may be divided into, for example, three or five.

In the control system according to the embodiment, in the process of Step S120 of FIGS. 2, 7, and 9 or the process of Step S230 in FIGS. 3, 8, and 10, the detected value ILd detected by the current sensor 40a and the sensor temperature Ts detected by the temperature sensor 40b are input a prescribed number of times Nref, the average value of the input sensor temperatures Ts is set as the learning temperature Tc, and the average value of the input detected values ILd is set as the offset value ILoff at the learning temperature Tc. However, the prescribed number of times Nref may be set to one, the input sensor temperature T may be set as the learning temperature Tc, and the detected value ILd may be set as the offset value ILoff at the learning temperature Tc.

In the control system according to the embodiment, the battery 36 configured as a lithium-ion secondary battery or a nickel-hydride secondary battery is used as a power storage device, but a capacitor instead of the battery 36 may be used as the power storage device.

In the embodiment, the control system is applied to the drive device 20. However, the control system may be applied to a device other than the drive device 20.

In the embodiment, the disclosure is embodied in the form of a control system, but may be embodied in the form of a control method for a control system.

Correspondence between principal elements of the embodiment and principal elements of the disclosure described in the SUMMARY will be described below. In the embodiment, the boost converter 40 is an example of a "boost converter," the current sensor 40a is an example of a "current sensor," and the ECU 70 is an example of an "electronic control unit." The nonvolatile memory 70a is an example of a "nonvolatile memory."

The disclosure can be used in the industry of manufacturing control systems of a boost converter.

What is claimed is:

1. A control system of a boost converter, the control system comprising:
   a boost converter configured to exchange power between a first power line and a second power line through conversion of a voltage, the first power line being connected to a power storage device, the second power line being connected to an inverter that drives a motor;
   a current sensor configured to detect a current flowing in the boost converter; and
   an electronic control unit configured to set a plurality of prescribed temperature ranges of a temperature of the current sensor, the electronic control unit being configured to control the boost converter using a detected value detected by the current sensor, the electronic control unit being configured to perform following operations i) and ii) in each of the plurality of prescribed temperature ranges,
   i) executing intermittent step-up control and learning of an offset value of the current sensor, the intermittent step-up control being control of intermittently operating the boost converter such that a voltage of the second power line becomes a target voltage, and
   ii) controlling the boost converter using a corrected current value, the corrected current value being a value obtained by correcting the detected value using a correction value, the correction value being calculated using the learned offset value and the temperature of the current sensor.

2. The control system according to claim 1, wherein
the electronic control unit is configured to prepare a correction value table using the learned offset value and a learning temperature when the offset value has been learned, the learning temperature being the temperature of the current sensor when the learned offset value is being learned, and
the electronic control unit is configured to set a value acquired from the correction value table using the temperature of the current sensor as the correction value.

3. The control system according to claim 1, wherein
the electronic control unit is configured not to execute the learning of the offset value when the temperature of the current sensor is within one of the prescribed temperature ranges and the learning of the offset value within the one of the prescribed temperature ranges has been already executed.

4. The control system according to claim 1, wherein
the electronic control unit is configured to initialize a result of learning of the offset value when a request for stopping the control system has been issued.

5. The control system according to claim 1, wherein
the electronic control unit includes a nonvolatile memory that stores data,
   the electronic control unit is configured to store the learned offset value in the nonvolatile memory when the offset value has been learned, and
   the electronic control unit is configured to calculate the correction value from the temperature of the current sensor and the learned offset value stored in the nonvolatile memory.

6. The control system according to claim 5, wherein
the electronic control unit is configured to count the number of times of starting of the control system after learning of the offset value has been executed, and
the electronic control unit is configured to initialize the learned offset value stored in the nonvolatile memory when the counted number of times of starting of the control system is greater than a predetermined number of times.

7. The control system according to claim 5, wherein
the electronic control unit is configured to count the number of times of starting of the control system after learning of the offset value has been executed for each of the plurality of prescribed temperature ranges, and
the electronic control unit is configured to initialize the learned offset value in the prescribed temperature range in which the counted number of times of starting is greater than a predetermined number of times among the learned offset values stored in the nonvolatile memory, when the counted number of times of starting of the control system is greater than the predetermined number of times.

8. A control method for a control system of a boost converter, the control system including a boost converter configured to exchange power between a first power line and a second power line through conversion of a voltage, a current sensor configured to detect a current flowing in the boost converter, and an electronic control unit configured to set a plurality of prescribed temperature ranges of a temperature of the current sensor, the first power line being connected to a power storage device, the second power line being connected to an inverter that drives a motor,
   the control method comprising:
   when in each of the plurality of prescribed temperature ranges,
      i) executing, by the electronic control unit, intermittent step-up control and learning of an offset value of the current sensor, the intermittent step-up control being control of intermittently operating the boost converter such that a voltage of the second power line becomes a target voltage; and
      ii) controlling, by the electronic control unit, the boost converter using a corrected current value, the corrected current value being a value obtained by correcting a detected value using a correction value, the correction value being calculated using the learned offset value and the temperature of the current sensor.

9. The control system according to claim 1, further comprising:
a temperature sensor configured to detect a temperature of the current sensor in each of the plurality of prescribed temperature ranges.

10. The control system according to claim 9, wherein each of the plurality of prescribed temperature ranges are different ranges.

11. The control method according to claim 8, further comprising:
a temperature sensor configured to detect a temperature of the current sensor in each of the plurality of prescribed temperature ranges.

12. The control method according to claim 11, wherein each of the plurality of prescribed temperature ranges are different ranges.

* * * * *

UNITED STATES PATENT AND TRADEMARK OFFICE
CERTIFICATE OF CORRECTION

PATENT NO. : 10,381,931 B2
APPLICATION NO. : 16/106827
DATED : August 13, 2019
INVENTOR(S) : Kazuyoshi Satoh et al.

It is certified that error appears in the above-identified patent and that said Letters Patent is hereby corrected as shown below:

In the Specification

In Column 1, Line 43, after "learning", delete ",".

In Column 4, Line 44, after "illustrating", delete ",".

In Column 5, Line 3, after "includes", delete "e" and insert --a--, therefor.

In Column 6, Line 59, after "switch", delete "30" and insert --80--, therefor.

In Column 13, Line 3, after "learning", delete ",".

Signed and Sealed this
First Day of October, 2019

Andrei Iancu
*Director of the United States Patent and Trademark Office*